United States Patent [19]

Tanaka

[11] Patent Number: 4,555,670

[45] Date of Patent: Nov. 26, 1985

[54] DIFFERENTIAL AMPLIFIER

[75] Inventor: Tatsuo Tanaka, Yokohama, Japan

[73] Assignee: Kabushiki Kaisha Toshiba, Japan

[21] Appl. No.: 669,330

[22] Filed: Nov. 8, 1984

[30] Foreign Application Priority Data

Nov. 30, 1983 [JP] Japan .............................. 58-225726

[51] Int. Cl.$^4$ .............................................. H03F 3/45
[52] U.S. Cl. ..................................... 330/252; 330/257
[58] Field of Search ................ 330/252, 257, 259, 261

[56] References Cited

U.S. PATENT DOCUMENTS

| 3,440,554 | 4/1969 | McGraw et al. | 330/252 |
| 3,564,439 | 2/1971 | Rao | 330/252 |
| 4,272,728 | 6/1981 | Wittlinger | 330/253 |

FOREIGN PATENT DOCUMENTS

| 1966421 | 9/1969 | Fed. Rep. of Germany . |
| 2139560 | 8/1971 | Fed. Rep. of Germany . |
| 400002 | 2/1974 | U.S.S.R. | 330/252 |

Primary Examiner—Eugene LaRoche
Assistant Examiner—G. Wan
Attorney, Agent, or Firm—Finnegan, Henderson, Farabow, Garrett & Dunner

[57] ABSTRACT

A differential amplifier is disclosed which comprises: a first differential amplifying circuit comprising first and second transistors of an NPN type, the collector of the first transistor constituting an output terminal of the amplifier; a second differential amplifying circuit comprising third and fourth transistors of the NPN type whose bases are inverting and noninverting input terminals, respectively, the base of the third transistor being connected to the collector of the second transistor, and the base of the fourth transistor being supplied with a bias voltage; a first load circuit for the first differential amplifying circuit, the first load circuit comprising a fifth transistor of a PNP type forming a collector load for the second transistor and a sixth transistor of the PNP type for forming a collector load for the first transistor, the bases of the fifth and sixth transistors being connected to the collector of the fourth transistor; and a second load circuit for the second differential amplifying circuit.

9 Claims, 9 Drawing Figures

F I G. 6
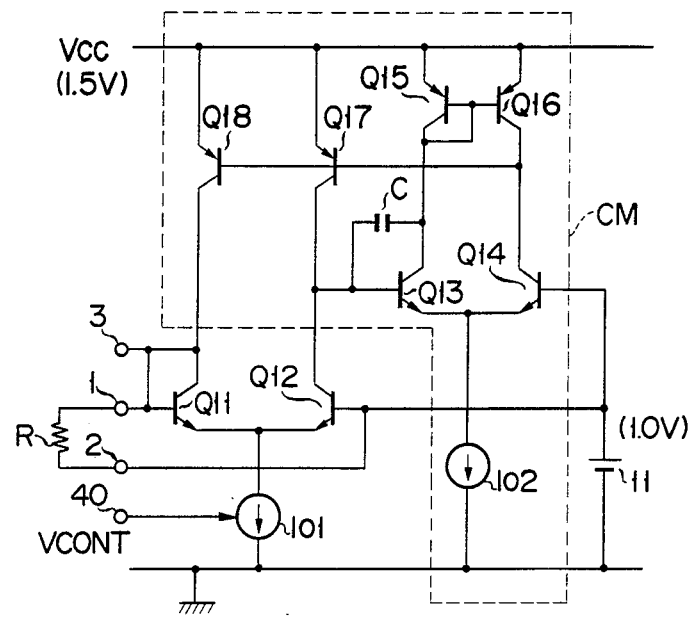
F I G. 7
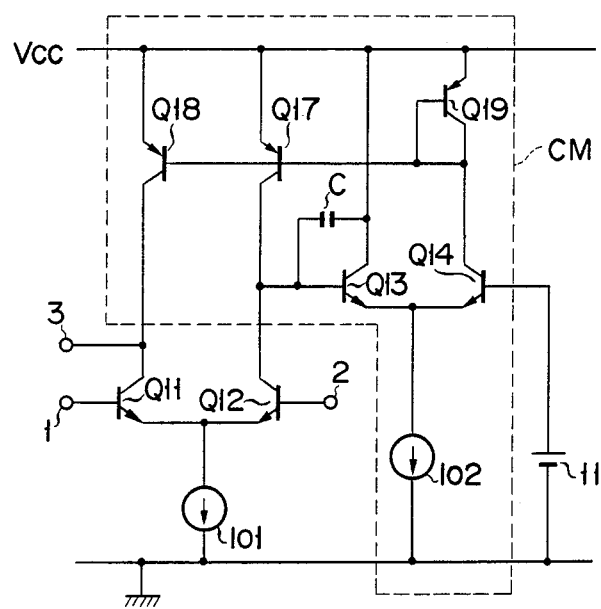

DIFFERENTIAL AMPLIFIER

BACKGROUND OF THE INVENTION

This invention relates to a differential amplifier having a current mirror circuit as a load for a differential amplifying circuit and suitably used with low power source voltage.

In FIG. 1, NPN transistors Q1 and Q2 constitute a differential amplifying circuit. The emitters of the transistors Q1 and Q2 are connected together. A constant current source Io is connected between the emitter junction of the transistors Q1 and Q2 and ground. A current mirror circuit CM is provided between the transistors Q1, Q2 and a power source voltage $V_{CC}$. The current mirror circuit CM comprises PNP transistors Q3, Q4 and resistors R1, R2. The base and collector of the transistor Q3 are connected together. A reference or primary current flows through the transistor Q3. The base of the transistor Q3 is connected to the base of the transistor Q4. A secondary current flows through the transistor Q4. The resistor R1 is connected between the emitter of the transistor Q3 and the power source voltage $V_{CC}$. The resistor R2 is connected between the emitter of the transistor Q4 and the power source voltage $V_{CC}$. Input terminals 1 and 2 are connected to the bases of the transistors Q1 and Q2, respectively. The output terminal 3 is connected to the collector of the transistor Q1.

The differential amplifier in FIG. 2 is different from that in FIG. 1 only in the structure of the current mirror circuit. The current mirror circuit in FIG. 2 is shown by a reference character CM'. The circuit CM' comprises the PNP transistors Q3, Q4 and PNP transistors Q5, Q6. The transistor Q5 is connected between the emitter of the transistor Q4 and the power source voltage $V_{CC}$. The emitter and base of the transistor Q5 are connected together. The transistor Q6 is connected between the emitter of the transistor Q3 and the power source voltage $V_{CC}$. The base of the transistor Q6 is connected to the base of the transistor Q5.

In the current mirror circuits CM, CM', assume that the primary current and secondary current are equal. In this case, when a signal potential V1 at the input terminal 1 is higher than the signal potential V2 at the input terminal 2, a current flows through the output terminal 3 into the collector of the transistor Q1 as a part of the collector current, together with the current flowing from the transistor Q4 into the collector of the transistor Q1, so that the collector current of the transistor Q1 is larger than that of the transistor Q2. While, when the signal potential V1 is lower than the signal potential V2, a part of the collector current flowing from the transistor Q4 into the collector of the transistor Q1 flows out through the output terminal 3.

A voltage drop of the current mirror circuit CM in the differential circuit of FIG. 1 is relatively small. Therefore, the amplifier will operate with a power source of a relatively low voltage.

However, the base currents of the transistors 03, Q4 of the current mirror circuit CM may not be ignored when amplification factors of the transistors 03, Q4 are small. When the amplification factors of the transistors Q3, Q4 are small, the operation characteristic of the current mirror circuit CM is low. This causes a large offset of an output current through the output terminal 3. Also, with the amplifier of FIG. 1, the so called Early effect (i.e., in which the collector emitter voltage varies, according to the variation of the power source voltage, to vary the collector current) at the transistor Q4 varies the offset of the output current. Therefore, the amplifier of FIG. 1 is unsuitable for use with a wide range of the power source voltage used. The resistors R1, R2 are provided in the current mirror circuit CM in order to reduce the Early effect. This measurement, however, cannot significantly reduce the Early effect.

With the differential amplifier of FIG. 2, the transistors Q5, Q6 reduce the affection of the base currents of the transistors Q3, Q4 on the offset of the output current. This enhances the operation characteristic of the current mirror circuit CM'. However, this measurement still does not satisfactorily reduce the Early effect. Although small, the offset of the output current will still occur. Also, with the amplifier of FIG. 2, the diode connected transistor Q5 is connected between the emitter of the transistor Q5 and the power source voltage $V_{CC}$. The voltage drop at the transistor Q5 is relatively large. Therefore, the FIG. 2 amplifier is not suitable for use with a relatively low power source voltage, e.g., 0.9 V.

SUMMARY OF THE INVENTION

This invention has been achieved under the above mentioned circumstances and has as its object to provide a differential amplifier which is operable with a relatively low power source voltage and which has a small offset of an output current even when used with a power source voltage having a wide range.

According to the invention, there is provided a differential amplifier comprising first and second input terminals; an output terminal; a first differential amplifying circuit comprising first and second transistors of a first polarity type, the bases of the first and second transistors being connected to said first and second input terminals, respectively; a current source connected to said first differential amplifying circuit and a first predetermined potential; a second differential amplifying circuit comprising third and fourth transistors of said first polarity type, the base of the third transistor constituting an inverting input terminal and being connected to the base of said second transistor, and the base of the fourth transistor constituting a noninverting input terminal and being connected to a bias potential; a load circuit for said second differential amplifying circuit; a fifth transistor of a second polarity type forming a collector load for said second transistor, the base of the fifth transistor being connected to the collector of said fourth transistor; and a sixth transistor of said second polarity type for forming a collector load for said first transistor, the base of the sixth transistor being connected to the base of said fifth transistor.

BRIEF DESCRIPTION OF THE DRAWINGS

FIG. 6 shows a circuit diagram of a variable resistor circuit which is a modification of the amplifier of FIG. 3;

FIG. 7 shows a circuit diagram of a differential amplifier according to a further embodiment of the invention;

DETAILED DESCRIPTION OF THE PREFERRED EMBODIMENTS

Figure 1:
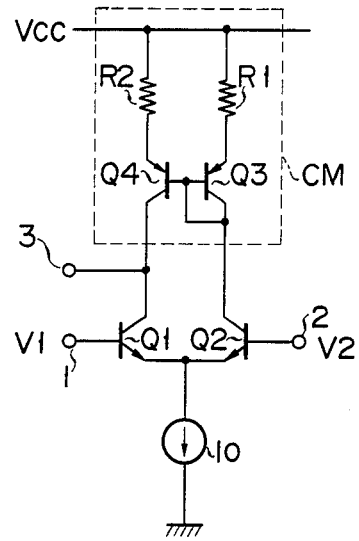
FIG. 1 shows a circuit diagram of a conventional differential amplifier.
Figure 2:
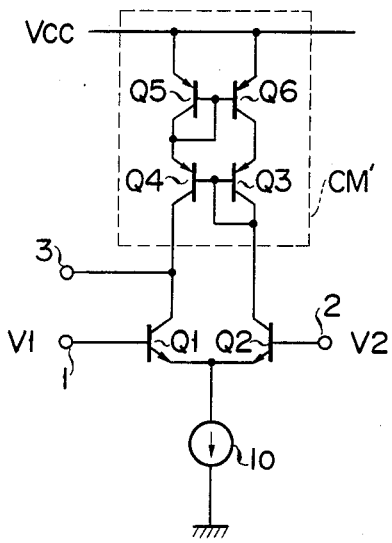
FIG. 2 shows a circuit diagram of another conventional differential amplifier.
Figure 3:
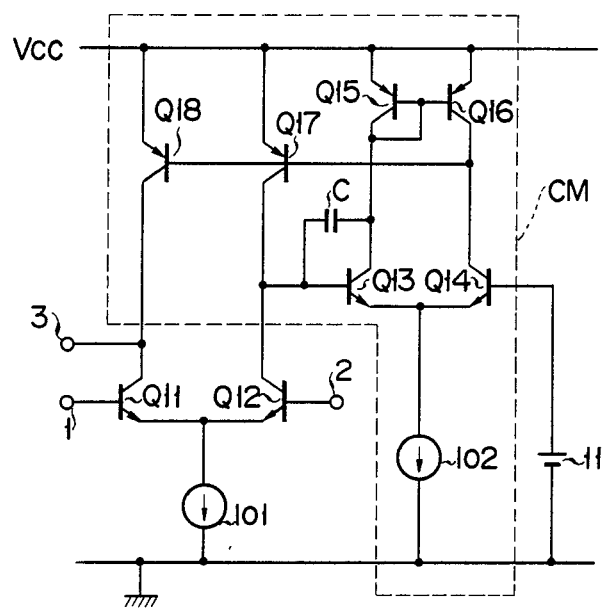
FIG. 3 shows a circuit diagram of a differential amplifier according to an embodiment of the invention.

In FIG. 3, NPN transistors Q11 and Q12 constitute a first differential amplifying circuit. The transistors Q11 and Q12 have a high amplification factor. The bases of the transistors Q11 and Q12 constitute inverting and noninverting input terminals, respectively. The emitters of the transistors Q11 and Q12 are connected together. A constant current source Io1 is connected between the emitter junction of the transistors Q11 and Q12 and ground. NPN transistors Q13 and Q14 constitute a second differential amplifying circuit. The transistors Q13 and Q14 have a high amplification factor. The bases of the transistors Q13 and Q14 constitute inverting and noninverting input terminals, respectively. The emitters of the transistors Q13 and Q14 are connected together. The base of the transistor Q14 (noninverting input terminal) is connected to the positive terminal of a bias voltage source 11. The base of transistor Q13 (inverting input terminal) is connected to the collector of transistor Q12. A PNP transistor Q15 is connected between the collector of transistor Q13 and the power source voltage $V_{CC}$. The transistor Q15 is a load element for the transistor Q13. The base and collector of the transistor Q15 are connected together. A PNP transistor Q16 is connected between the collector of the transistor Q14 and the power source voltage $V_{CC}$. The transistor Q16 is a load element for the transistor Q14. The base of the transistor Q16 is connected to the base of the transistor Q15. A PNP transistor Q17 is connected between the collector of the transistor Q12 and the power source voltage $V_{CC}$. The transistor Q17 is a load element for the transistor Q12. A PNP transistor Q18 is connected between the collector of the transistor Q11 and the power source voltage $V_{CC}$. The transistor Q18 is a load element for the transistor Q11. The bases of the transistors Q17, Q18 are both connected to the collector of the transistor Q14. The transistors Q17 and Q18 have the same or substantially the same characteristics. The transistors Q13, Q14, Q15, Q16, Q17, Q18 and the second constant current source Io2 constitute a current mirror circuit CM. A capacitor C is connected between the collector and base of the transistor Q13. The capacitor C prevents the current mirror circuit CM from oscillating to stabilize the operation thereof. Input terminals 1 and 2 are connected to the bases of the transistors Q11 and Q12, respectively. The output terminal 3 is connected to the collector of the transistor Q11.

In the differential amplifier shown in FIG. 3, a base potential of the transistor Q13 follows a base potential of the transistor Q14 and is therefore equal to it. That is, the transistors Q13 and Q14 constitute a voltage follower circuit. Specifically, when the base potential of the transistor Q13 lowers, thereby reducing the collector current therethrough, the collector currents through the transistors Q15, Q16 reduce. In this case, the base current of the transistors Q17, Q18 increases by an amount corresponding to the reduction of the collector current through the transistor Q13. Therefore, the collector current flowing into the transistor Q17 increases, thereby reducing the collector emitter voltage thereof. This increases the base potential of the transistor Q17.

As described previously, the transistors Q17 and Q18 have the same or substantially the same characteristics and have their bases connected together. Therefore, the collector currents through the transistors Q17 and Q18 are equal. This prevents the offset of the output current of the amplifier from occurring.

In the amplifier of the embodiment, it is possible as an aspect of a circuit design that the transistors Q11 and Q12 have the same collector-emitter voltage, and the transistors Q17 and Q18 also have the same collector-emitter voltage. In this case, the offset of the output current does not occur over a wide range of the power source voltage used.

In the operation above, it is assumed that the base currents of the transistors Q11, Q12, Q13, Q14 are substantially zero.

Collector-emitter voltage drops of the transistor Q17, Q18 constituting the load elements for the transistors, Q12, Q11, respectively, are small. Therefore, the amplifier can operate even with a relatively low power source voltage.

Figure 4:
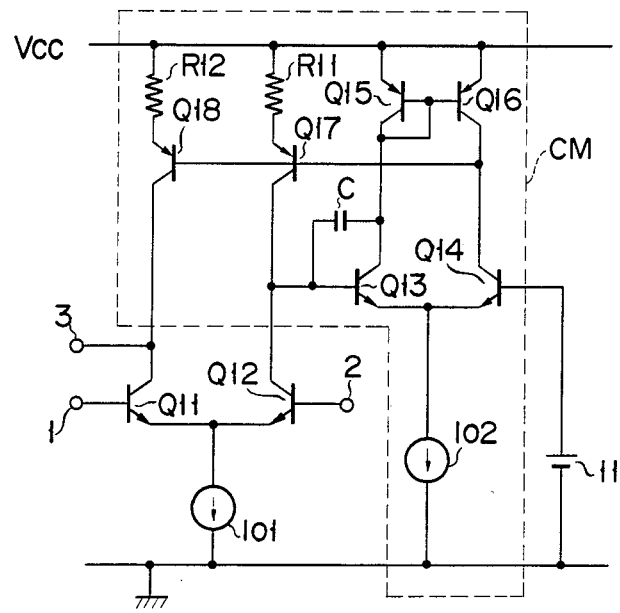
FIG. 4 shows a circuit diagram of a differential amplifier according to another embodiment of the invention.

FIG. 4 shows a circuit diagram of a differential amplifier according to a second embodiment of the invention. The FIG. 4 amplifier is different from the FIG. 3 amplifier only in that resistors R11 and R12 are provided. Therefore, the same or corresponding numerals or characters are used for other same or corresponding parts or elements; the descriptions thereof being omitted. The resistor R11 is connected between the power source voltage $V_{CC}$ and the emitter of the transistor Q17. The resistor R12 is connected between the power source voltage $V_{CC}$ and the emitter of the transistor Q18. The resistors R11 and R12 have a small resistance. The resistor R11 is used to limit the current flowing through the transistor Q17. The resistor R12 is used to limit the current flowing through the transistor Q18.

Figure 5:
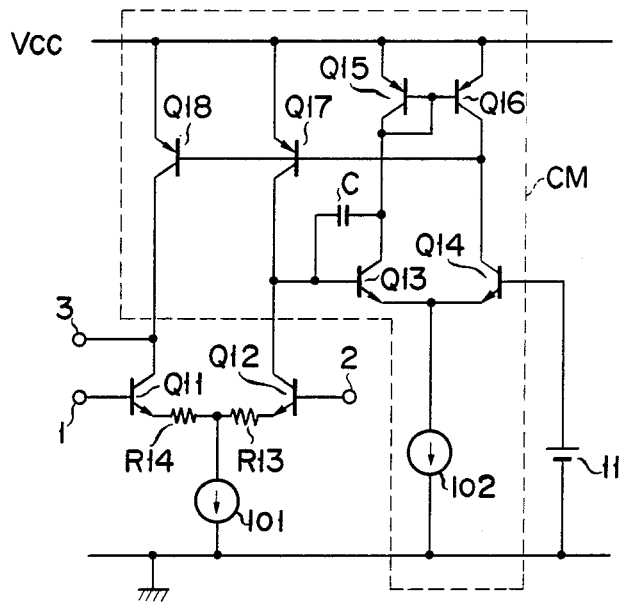
FIG. 5 shows a circuit diagram of a differential amplifier according to still another embodiment of the invention.

FIG. 5 shows a circuit diagram of a differential amplifier according to a third embodiment of the invention. The FIG. 5 amplifier is different from the FIG. 3 amplifier only in that degenerated resistors R13 and R14 are provided for the emitters of the transistors Q11 and Q12, respectively. Therefore, the same or corresponding numerals or characters are used for other same or corresponding parts or elements; the descriptions thereof being omitted. The resistor R13 is connected between the emitter of the transistor Q12 and the current source Io1. The resistor R14 is connected between the emitter of the transistor Q11 and the current source Io1. The resistors R13 and R14 have a small resistance. The resistor R13 is used to limit the current flowing through the transistor Q12. The resistor R14 is used to limit the current flowing through the transistor Q11.

FIG. 6 shows a modification of the amplifier of FIG. 3. The modified circuit of FIG. 6 operates as a variable resistor circuit. In the circuit of FIG. 6, a bias resistor R is connected across the input terminals 1 and 2. The input terminal 1 is connected to the positive terminal of the bias power source 11 through the bias resistor R. The input terminal 2 is directly connected to the positive terminal. The output terminal 3 is connected to the input terminal 1. The first constant current source Io1 is controlled by a control signal Vcont applied through a control terminal 40 to which the control signal Vcont is applied. Other parts or portions of the circuit of FIG. 6 are the same or substantially the same as those of the circuit of FIG. 3; the descriptions thereof being omitted. In the FIG. 6 circuit, the power source voltage $V_{CC}$ is 1.5 V, for example, and the bias source voltage 11 is 1.0 V, for example.

In the FIG. 6 circuit, an impedance Z at the base side of the transistor Q11 as viewed from the output terminal 3 is generally given by the following equation:

$$Z = 2Vt/Io1,$$

Here, Vt is a thermal voltage and given as follows:

$$Vt = kT/q,$$

where
- k: blotzman constant ($1.38 \times 10^{-23}$ J/°K),
- T: absolutely temperature, and
- q: charge of electron ($1.60 \times 10^{-19}$ coulomn).

In obtaining the equation of impedance Z, the bias resistor R is not taken into consideration.

As will be clear, the impedance Z is inversely proportional to an output current of the constant current source Io1.

FIG. 7 shows a differential amplifier according to a fourth embodiment of the invention. In the amplifier of this embodiment, the transistors Q15 and Q16 are omitted. The collector of the transistor Q13 is directly connected to the power source voltage $V_{CC}$. A NPN transistor Q19 is provided between the power source voltage $V_{CC}$ and the collector of the transistor Q14. The collector and base of the transistor Q19 are connected together. Other parts or portions are the same or the substantially the same as those of the FIG. 3 embodiment. Therefore, the same or the substantially the same numerals or characters are employed for same or the substantially the same parts or portions; the descriptions thereof being omitted. Also in this amplifier of FIG. 7 embodiment, the transistors Q13 and Q14 constitute a voltage follower circuit in which the base potential of the transistor Q13 follows to the base potential of the transistor Q14. Therefore, the collector currents through the transistors Q17, Q18 are equal. Therefore, also in this embodiment, the results the same as those obtained by the FIG. 3 embodiment are obtained.

Figure 8:
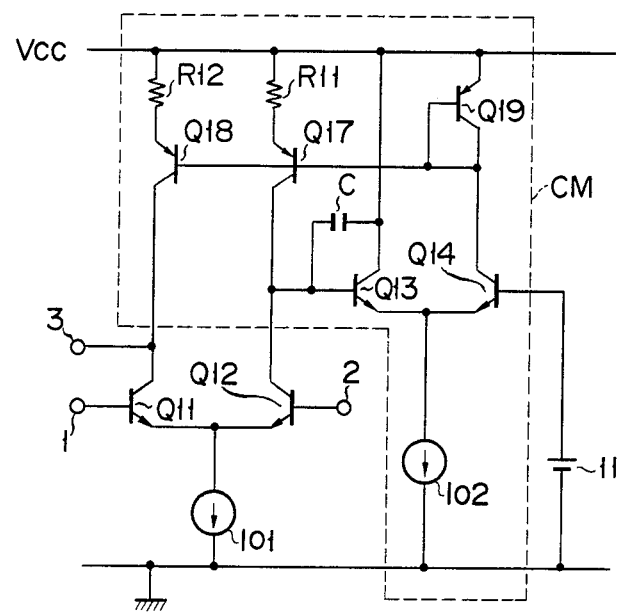
FIG. 8 shows a circuit diagram of a differential amplifier according to a still further embodiment of the invention.

FIG. 8 shows a circuit diagram of a differential amplifier according to a fifth embodiment of the invention. The FIG. 8 amplifier is different from the FIG. 7 amplifier only in that resistors R11 and R12 are provided. Therefore, the same or corresponding numerals or characters are used for the same or corresponding parts or elements; the descriptions thereof being omitted. The resistor R11 is connected between the power source voltage $V_{CC}$ and the emitter of the transistor Q17. The resistor R12 is connected between the power source voltage $V_{CC}$ and the emitter of the transistor Q18. The resistors R11 and R12 have a small resistance. The resistor R11 is used to limit the current flowing through the transistor Q17. The resistor R12 is used to limit the current flowing through the transistor Q18.

Figure 9:
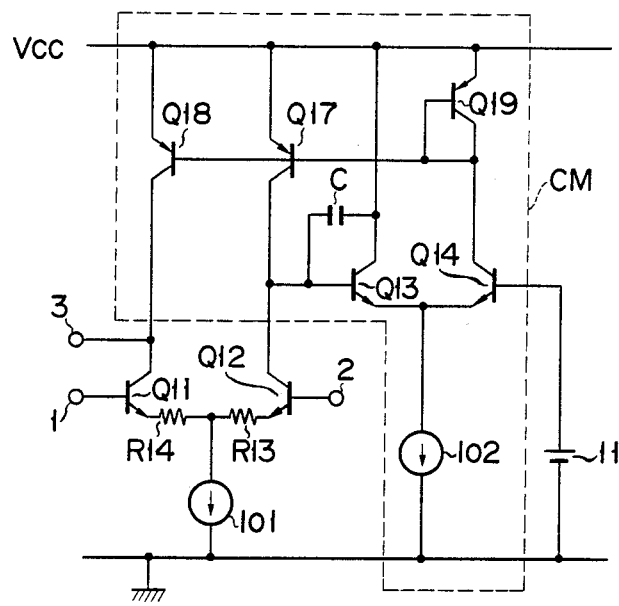
FIG. 9 shows a circuit diagram of a differential amplifier according to a still further embodiment of the invention.

FIG. 9 shows a circuit diagram of a differential amplifier according to a sixth embodiment of the invention. The FIG. 9 amplifier is different from the FIG. 7 amplifier only in that degenerated resistors R13 and R14 are provided for the emitters of the transistors Q11 and Q12, respectively. Therefore, the same or corresponding numerals or characters are used for the same or corresponding parts or elements; the descriptions thereof being omitted. The resistor R13 is connected between the emitter of the transistor Q12 and the current source Io1. The resistor R14 is connected between the emitter of the transistor Q11 and the current source Io1. The resistors R13 and R14 have a small resistance. The resistor R13 is used to limit the current flowing through the transistor Q12. The resistor R14 is used to limit the current flowing through the transistor Q11.

In the embodiments described above, the NPN transistors may be replaced by PNP transistors and vice versa. In this case, it is obvious that potentials between ground and the power source voltage $V_{CC}$ should be reversed.

As is clear from the above descriptions, the differential amplifier of the invention operates with a relatively low power source voltage and over a wide range of the power source voltage. Also the amplifiers of this invention will not occur the offset of the output current of the amplifiers.

This invention is not limited to the above embodiments. It is obvious for those skilled in the art that other embodiments would be thought within the spirit of the subject matter defined in the claims of this invention.

What is claimed is:

1. A differential amplifier comprising:
   first and second input terminals;
   an output terminal;
   a first differential amplifying circuit comprising first and second transistors of a first polarity type, the bases of the first and second transistors being connected to said first and second input terminals, respectively;
   a current source connected to said first differential amplifying circuit and a first predetermined potential;
   a second differential amplifying circuit comprising third and fourth transistors of said first polarity type, the base of the third transistor constituting an inverting input terminal and being connected to the collector of said second transistor, and the base of the fourth transistor constituting a noninverting input terminal and being connected to a bias potential;
   a load circuit for said second differential amplifying circuit;
   a fifth transistor of a second polarity type forming a collector load for said second transistor, the base of the fifth transistor being connected to the collector of said fourth transistor; and
   a sixth transistor of said second polarity type for forming a collector load for said first transistor, the base of the sixth transistor being connected to the base of said fifth transistor.

2. A differential amplifier according to claim 1, wherein said load circuit comprises seventh and eighth transistors, the seventh transistor being inserted between the collector of said third transistor and a second predetermined potential and having the collector and base connected together, and the eighth transistor being connected between the collector of said fourth transistor and said second predetermined potential and having the base connected to the base of the seventh transistor.

3. A differential amplifier according to claim 1, wherein said load circuit comprises a seventh transistor of said second polarity type connected between the collector of said fourth transistor and a second predetermined potential, the collector and base of the seventh transistor being connected together, and the collector of said third transistor being connected to said second predetermined potential.

4. A differential amplifier according to claim 1, further comprising a first resistor connected between a second predetermined potential and the emitter of said fifth transistor and a second resistor connected between said second predetermined potential and the emitter of said sixth transistor.

5. A differential amplifier according to claim 2, further comprising a first resistor connected between said second predetermined potential and the emitter of said fifth transistor and a second resistor connected between said second predetermined potential and the emitter of said sixth transistor.

6. A differential amplifier according to claim 3, further comprising a first resistor connected between said second predetermined potential and the emitter of said fifth transistor and a second resistor connected between said second predetermined potential and the emitter of said sixth transistor.

7. A differential amplifier according to claim 1, further comprising a first resistor connected between the emitter of said second transistor and said current source and a second resistor connected between the emitter of said first transistor and said current source.

8. A differential amplifier according to claim 2, further comprising a first resistor connected between the emitter of said second transistor and said current source and a second resistor connected between the emitter of said first transistor and said current source.

9. A differential amplifier according to claim 3, further comprising a first resistor connected between the emitter of said second transistor and said current source and a second resistor connected between the emitter of said first transistor and said current source.

* * * * *